United States Patent
Goun et al.

(10) Patent No.: US 12,038,489 B2
(45) Date of Patent: Jul. 16, 2024

(54) SYSTEM FOR RADIO FREQUENCY ILLUMINATION BASED TEMPERATURE MODULATED-NUCLEAR QUADRUPOLE RESONANCE (TM-NQR) AND SIGNATURE DETECTION OF POTENTIAL THREAT MATERIALS

(71) Applicant: The Trustees of Princeton University, Princeton, NJ (US)

(72) Inventors: Alexei Goun, Plainsboro, NJ (US); Herschel Rabitz, Lawrenceville, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 17/920,202

(22) PCT Filed: Apr. 21, 2021

(86) PCT No.: PCT/US2021/028363
§ 371 (c)(1),
(2) Date: Oct. 20, 2022

(87) PCT Pub. No.: WO2021/216683
PCT Pub. Date: Oct. 28, 2021

(65) Prior Publication Data
US 2023/0273282 A1 Aug. 31, 2023

Related U.S. Application Data

(60) Provisional application No. 63/013,724, filed on Apr. 22, 2020.

(51) Int. Cl.
G01R 33/44 (2006.01)
G01R 33/34 (2006.01)
G01R 33/36 (2006.01)

(52) U.S. Cl.
CPC ..... *G01R 33/441* (2013.01); *G01R 33/34015* (2013.01); *G01R 33/3607* (2013.01)

(58) Field of Classification Search
CPC ........... G01R 33/34015; G01R 33/441; G01R 33/3607
See application file for complete search history.

(56) References Cited

U.S. PATENT DOCUMENTS 5,206,592 A 4/1993 Buess et al.
7,170,288 B2 * 1/2007 Fullerton ............. G01R 33/441
324/300

(Continued)

OTHER PUBLICATIONS

International Search Report and Written Opinion for corresponding PCT Application No. PCT/US2021/028363, dated Jul. 26, 2021.

(Continued)

*Primary Examiner* — Gregory H Curran
(74) *Attorney, Agent, or Firm* — MEAGHER EMANUEL LAKS GOLDBERG & LIAO, LLP

(57) ABSTRACT

Systems and methods are described, and one method includes illuminating a target-of-interest (TI) with an RF energy configured to effect, over a time duration extending from a first time to a second time, an increase in a temperature of the TI. At a first detection time within the time duration, a first temperature NQR signal spectrum of the TI is detected, and a corresponding first temperature NQR spectrum data set is generates. At a second detection time, subsequent to the first detection time, a second temperature NQR signal spectrum of the TI is detected and corresponding second temperature NQR spectrum data set is output. Based at least in part on the first temperature NQR spectral dataset and the second temperature NQR spectral dataset, the TI is classified between including the SI and not including the SI.

18 Claims, 12 Drawing Sheets

(56) References Cited

U.S. PATENT DOCUMENTS

| | | | |
|---|---|---|---|
| 7,791,342 B2 * | 9/2010 | Sauer | G01R 33/441 |
| | | | 324/309 |
| 9,500,609 B1 * | 11/2016 | Zank | G01N 24/084 |
| 2011/0181281 A1 | 7/2011 | Itozaki | |
| 2016/0174868 A1 | 6/2016 | Tarasek et al. | |

OTHER PUBLICATIONS

Bray, P. J., "NMR and NQR studies of boron in vitreous and crystalline borates", Inorganica Chimica Acta (1999), 158-173, 289, Elsevier.

Lavric, Z. et al., "Application of 14N NQR to the study of piroxicam polymorphism", Journal of Pharmaceutical Sciences (2010), 4857-4865, , 99(12), Wiley-Liss, Inc. and the American Pharmacists Association.

Smith, J. A. S., "Nuclear Quadrupole Resonance Spectroscopy General principles", Journal of Chemical Education (1971), 39-48, 48(1).

Tantum, S. L. et al., "Signal processing for NQR discrimination of buried land mines", Detection and Remediation Technologies for Mines and Minelike Targets IV (1999), vol. 3710, AeroSense '99, Orlando, FL, United States (1999), 474-482.

* cited by examiner

SYSTEM FOR RADIO FREQUENCY ILLUMINATION BASED TEMPERATURE MODULATED-NUCLEAR QUADRUPOLE RESONANCE (TM-NQR) AND SIGNATURE DETECTION OF POTENTIAL THREAT MATERIALS

CROSS REFERENCE TO RELATED APPLICATION

This application claims priority from U.S. Provisional Patent Application Ser. No. 63/013,724 filed Apr. 22, 2020, which is hereby incorporated by reference herein in its entirety.

TECHNICAL FIELD

This application pertains to detection through induced nuclear quadrupole resonance.

BACKGROUND

Nuclear Quadrupolar Resonance (NQR) is a technique that has held promise for detection of substances such as nitrogen-14 (N14), a component of various explosives and prohibited non-explosive substances. N14 and certain other atomic nuclei exhibit a "quadrupolar" magnetic moment that NQR techniques, subject to certain significant real-world limitations, aim to utilize for detection. In brief, nuclei of N14 and certain other quadrupolar magnetic polarization nuclei have a rest polarization state. NQR techniques perturb such nuclei away from their resting state to higher energy polarization states, using pulsed high frequency (HF) excitation fields. The quadrupolar magnetic polarizations then return, through a precession, back to the resting state. The precession radiates NQR electromagnetic signals, and the frequency spectrum of such signals has a material-specific signature. However, there are technical matters extant in conventional NQR techniques that, in certain applications and environments, can detract from NQR's use as a fieldable tool for substance detection.

One of the technical matters is strong dependence of NQR signal spectra on temperature of the NQR active nuclei. The temperature dependence can necessitate, in current NQR techniques, measurement of test subject temperature. The measurement can create a plurality of costs, e.g., costs of equipment procurement and maintenance, cost in terms of substance sensing time and throughput. At a higher level, the temperature measurement can present various application-specific issues, e.g., difficulties of measurement in cluttered environments, difficulties of measuring temperature of concealed items, and of measuring temperature of moving targets.

Another of the technical matters that can affect conventional NQR is that NQR signals are inherently weak. Still another technical matter is that spectral lines of NQR signals can be close to the spectrum of NQR measurement noise. The NQR signal weakness and NQR measurement noise, singly and in combination, can render NQR signals susceptible to interference by the process that creates and measures them.

SUMMARY

This Summary is provided to introduce a selection of concepts in a simplified form. These as well as other concepts are further described below in the Detailed Description. This Summary is not intended to identify key features or essential features of the claimed subject matter, nor is it intended to be used to limit the scope of the claimed subject matter.

An example of disclosed systems can include a pulsed high frequency (HF) field source, configured to establish in a detection space a pulsed HF excitation field configured to excite NQR resonance of a component material of a target of interest (TI), and can include a radio frequency (RF) heater, configured to illuminate a TI while in the pulsed HF excitation field in the detection space, with an RF energy configured to effect a temperature increase in the TI. The example can further a spectral receiver, configured to receive signal radiations from a direction of the detection space, over a plurality of time intervals in the pulsed HF excitation field, during the RF heater illuminating the TI, and to output a corresponding plurality of NQR spectral datasets; and can include an SI presence classifier, configured to perform a process that can include classifying, based at least in part on the plurality of NQR spectral datasets, the TI between including the SI and not including the SI.

An example of disclosed methods can include illuminating TI with an RF energy configured to effect, over a time duration extending from a first time to a second time that is subsequent the first time, an increase in a temperature of the TI, and can include measuring at a time corresponding to the first time a first temperature NQR signal spectrum of the TI, outputting a corresponding first NQR spectrum data set, and measuring at a time corresponding to the second time a second temperature NQR signal spectrum of the TI, and outputting a corresponding second NQR spectrum data set. The example can include classifying, based at least in part on the first temperature NQR spectral dataset and the second temperature NQR spectral dataset, the TI between including the SI and not including the SI.

Another example of disclosed methods can include effecting a temperature increase in a TI, within a detection space, by operations including illuminating the TI with an RF energy configured for absorption by the TI, the example method further including establishing in the detection space, while illuminating the TI with the RF energy configured for absorption by the TI, a pulsed HF excitation field configured to excite NQR resonance of an SI. The example can further include receiving signal radiations from a direction of the detection space, during time intervals between successive pulses of the pulsed HF excitation field, during the RF energy illuminating the TI, and outputting a corresponding plurality of NQR spectral datasets. The example can also include classifying, based at least in part on the plurality of NQR spectral datasets, the TI between including the SI and not including the SI.

BRIEF DESCRIPTION OF THE DRAWINGS

Description of various concepts and embodiments includes references to the accompanying figures which show illustrative, not limitative examples. It will be understood that figure graphics are scaled for readability and therefore various functions and features are not necessarily drawn with a scale consistent with physical implementations.

DETAILED DESCRIPTION

Figure 1:
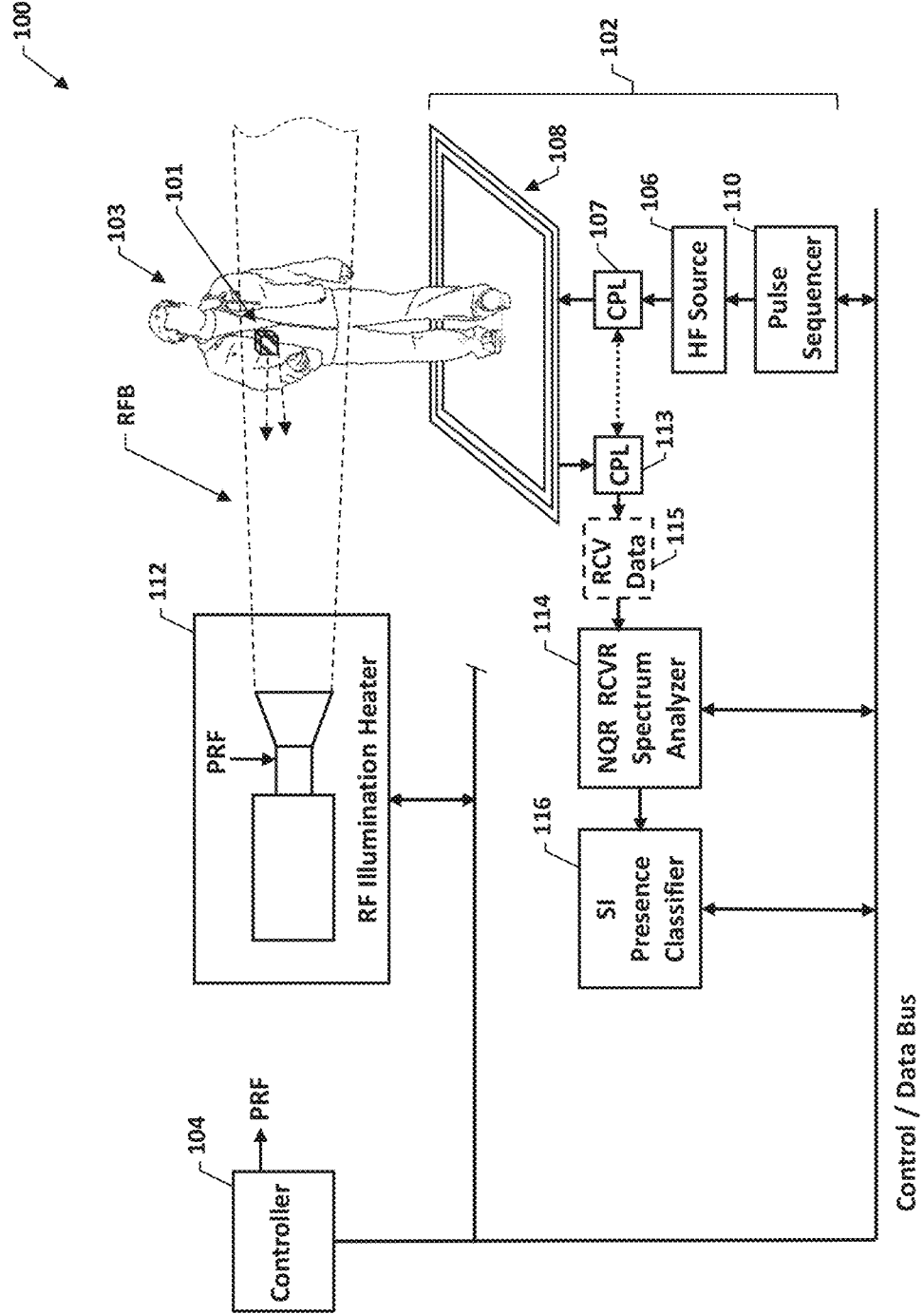
FIG. 1 shows a functional block schematic of a system for temperature-modulated (TM) nuclear quadrupole resonance (NQR) detection of substances of interest (SIs) in accordance with one or more embodiments.

As used in this herein, "e.g." and "for example" are mutually interchangeable without change in meaning, and each will be understood to mean "for example, but not limited to."

As used herein, the articles "a" and "an," as used herein in the specification and in the claims, unless clearly indicated to the contrary, understood to mean "at least one."

The term "or" as used herein in contexts such as "A or B" mean "either A or B, or both" of the elements so conjoined, i.e., elements that are conjunctively present in some cases and disjunctively present in other cases.

As will be understood upon reading this disclosure, features provided by the various embodiments include extremely effective, economical, readily fieldable solutions to current NQR shortcoming of temperature dependence. Embodiments provide with and through the solution a substantial advancements in NQR detection, through utilizations of the temperature dependance that transform it from a problem to a solution of the problem. Further features and aspects, without limitation, inherent material improvements in detection accuracy, i.e., improved sensitivity, with concurrent reduction in rates of false alarm and of rates of false misses, i.e., false no-alarm material.

One example system according to one or more embodiments includes, positioned in various respects relative to a detection area, a high frequency (HF) NQR excitation field source, an NQR signal receiver, and a radio frequency (RF) illumination heater. The NQR signal receiver can feed a spectrum analyzer and a classifier resource. Regarding detection area, one example can be an exterior door or entranceway to a building. Other illustrations are presented later in this disclosure. The HF NQR excitation field source can include an HF coil or a plurality of HF coils arranged proximal the detection area. The NQR signal receiver can include an HF coil or plurality of HF coils proximal the detection area, which can be but are not necessarily the same coil(s) used by the HF NQR excitation field source.

The RF illumination heater can be configured to transmit, e.g., in response to detecting a subject person approaching a detection area, an RF illumination beam toward the detection area. The RF illumination beam can be configured to illuminate any TI the subject person is carrying, at least over a specified range of body locations TIs can be carried.

The RF illumination heater transmits the RF beam illumination beam with an RF frequency that corresponds to RF absorption profiles of a range of TI materials, and at a signal power such that its illumination of TIs effectuates a temperature increase in the TI material. In an aspect, the RF illumination heater is configured to maintain the illumination beam, and its corresponding increasing of TI temperature with respect to time, for a heating interval. In an example system according to one or more embodiments, an NQR spectrum measurement process is repeated, at instances spaced apart in time, during the heating interval. The NQR spectrum measurement process can be performed by operations of HF NQR excitation field source, the NQR signal receiver, and the spectrum analyzer as will be described in greater detail in later sections of this disclosure.

In an embodiment, an RF total power limiting feature can be provided. Implementations can include, without limitation, a fixed-at-time-of-manufacture "do-not-exceed" cap. The specific value of the cap can be application-specific, but can one general guideline can be the Specific Absorption Rate of the human body, i.e., approximately 4 W/kg. Embodiments can also provide, for example, in transmitter frequency selection processes and component algorithms described in greater detail in later sections, selection of frequencies of the illuminating RF radiation that factors minimization of absorption by the human body, concurrent with being specific to and characteristic of absorption within the TI.

Due to the spacing in time between spectrum measurements and the continuing of the RF illumination beam, for each TI carried by the subject person, successive instances of the NQR spectrum measurement process obtain the TI's NQR spectrum at successively higher TI temperatures. Due to the temperature dependence of the NQR spectra of NQR active nuclei, for each TI having such nuclei, the successive instances the NQR spectrum measurement process will produce respectively different NQR spectra. The differences include frequency domain shifting of spectral lines, changing widths of spectral lines, and can include appearances and extinguishments of spectral lines. The differences can be different for different ones of the spectral lines, and can be different for different pairings of and other sub-sets of the spectral lines. The shifts and other changes are material-specific, i.e., NQR active nuclei exhibit signature shifts and other changes in spectral lines with respect to changes in temperature.

Systems and methods according to disclosed embodiments provide, through various features and combinations thereof, novel exploitation and utilization of this material-specific, signature temperature dependence of NQR spectra of NQR active nuclei. These features in turn can provide, without limitation a practical, economical, fieldable solution to the technical matter of NQR spectra temperature dependance, and technical solutions and ameliorations of NQR signal weakness measurement, and relates susceptibility to measurement noise.

FIG. 1 is a functional block schematic of a system 100 for temperature-modulated (TM) NQR detection of targets of interest (TIs) in accordance with one or more embodiments. The system 100 can include an NQR excitation field source 102 that can establish or create in detection space DPC an NQR excitation field. The NQR excitation field source 102 can include an HF source 106 that, e.g., via a source coupling 107, can couple to and drive an HF coil 108. The HF source 106 can be controlled, by a control signal generated by controller 104, as described in greater detail later in this disclosure, to feed the HF coil 108 a signal at frequency vHFfrq. The frequency vHFfrq can be adjusted in accordance with the NQR frequency of the NQR nuclei of the particular TI. The HF coil 108 radiates in turn an oscillating electromagnetic field at frequency vHFfrq that excites NQR active nuclei within both the TI and BI to emit radiation characteristic of said nuclei.

The NQR excitation field source 102 can include a pulse sequencer 110, that can couple to and control the HF source 104 to establish the NQR excitation field as a pulsed HF field, at a pulse repetition rate $VHF_{REP}$. The pulse repetition rate $VHF_{REP}$ can be controlled, for example, by a control signal generated by controller 104, as described in greater detail later in this disclosure.

FIG. 1 shows, as an example configuration of the HF coil 108, a single coil with a winding axis extending normal to a floor or ground surface. The FIG. 1 visible configuration of the HF coil 108 is only one example; it is not intended as a limitation on practices in accordance with disclosed embodiments. One example alternative configuration of the HF coil 108 include can be a single coil wound, for example, within a door frame or another portal frame. In such an example, the winding axis can extend in a plane normal to the winding axis of the FIG. 1 visible axis, e.g., parallel to the direction persons walk through the door or other portal. Another example configuration for the HF coil 108 can include a plurality, e.g., array, of coils. In one example, each of the plurality of HF coils can have a winding axis that normal to a floor or ground surface. Another configuration for the HF coil 108 can include a plurality of coils, each within a door frame or other portal frame, each with a winding axis extending in a plane parallel to a floor or other ground plane.

The system 100 can include an RF illumination heater 112 configured to transmit an RF illumination beam, such as the example labeled "RFB" in FIG. 1 with a beam width illuminating at least the example TI 101 carried by the person 103. The RF illumination beam RFB can also illuminate the above-described background of interest (BI) structures. Examples of BI structures can include, without limitation, a container surrounding the TI 101, the person 103 and other objects the person is carrying.

Technical features of the RF illumination beam RFB include, but are not limited to, active increasing in the temperature of the TI 101, and at least portions of the BI.

In an aspect, the pulse sequencer 110, HF source 106, and HF coil 108 can expose the TI 101 to a pulsed HF NQR excitation field. One non-limited example is a pulsed strong off-resonant comb (SORC) excitation. The SORC configuration, and other configurations of the HW NQR excitation field may be controlled, e.g., by operation of the controller 104 or other updating operation, for the resonance of the material(s) of the TI 101. The TI 101 material will radiate NQR signals in response to each of the SORC pulses and, in accordance with SORC, the pulse-to-pulse signals will be coherent.

The system 100 can include an NQR receiver—spectrum analyzer 114 that can have an input coupled or switchably coupled, e.g., via a receiver coupler 113, to the HF coil 108. Internal functionality of the NQR receiver—spectrum analyzer 114 can include, for example, a lock-in NQR amplifier function (not separately visible in FIG. 1) an analog-to-digital (A/D) converter function, and a spectrum analyzer function. In an aspect, certain functionalities or portions of functionalities, e.g., early stage input or signal conditioning aspects of the NQR receiver—spectrum analyzer 114 can be proximal, e.g., integrated in a door frame with or in another portal frame with, or in a floor mat with the HF coil 108.

FIG. 1 shows, as one example, a NQR receiver signal conditioner device 115. The NQR receiver signal conditioner device 115 can include an A/D converter, which can be a migration of the above-described A/D features of the NQR receiver—spectrum analyzer 114. The A/D converter function, either in the NQR receiver—spectrum analyzer 114 or in the NQR receiver signal conditioner device 115A, can be implemented by a commercial off-the-shelf (COTS) A/D.

The spectrum analyzer functionality of the NQR receiver—spectrum analyzer 114 can be implemented, for example, by a general purpose programmable computer that can include or have access to a tangible storage medium storing computer-readable instructions that, when executed by the computer, cause the computer to apply a Fast Fourier Transform (FFT) or other spectral analysis algorithm to a digitized output of the lock-in NQR amplifier function.

In an example operation, the NQR receiver—spectrum analyzer 114 can receive, in an offset synchronization with the pulse sequencer 110 control of the HF source 106 feeding the HF coil 108 a pulsed SORC or other pulsed coherent radiation excitation, to receive successive interpulse intervals of coherent NQR signals from the TI 101, averaging the coherent NQR signals, and performing spectral analysis on the average.

In an aspect the receiver coupler 113 and the source coupler 107 can each be configured as a switchable coupler, and controlled, e.g., by the controller 104, to operate in a synchronized, mutually exclusive manner. This can isolate the input of the NQR receiver—spectrum analyzer 114 device from the HF coil 108 during active generation of the NQR excitation pulses. Specific implementation and control of the receiver coupler 113 and source coupler 107 for such purposes can incorporate one or more HF coil feed-receive switched coupling isolation techniques from conventional NQR. Such techniques are known to persons of ordinary skill in the relevant arts and therefore further detailed description is omitted from this disclosure.

The system 100 can includes an SI presence classifier 116. Functionalities of the SI presence classifier 116 can include a multiple material, NQR temperature dependent spectrum signature database (not separately visible in FIG. 1) and can include a classifier functionality. The classifier functionality can include a logic for receiving, for example, successive NQR spectral datasets from the NQR receiver—spectrum analyzer 114 reflecting NQR spectra from the TI 101 at different temperatures. The classifier functionality can use the differences directly, or can compute a difference metric or difference vector, and use the difference, the metric, or the difference vector to search the database. In alternative implementation, classifier functionality of the SI presence classifier 116 can include an artificial intelligence (AI) functionality. An example AI implementation can include a training using a database, for a plurality of different SIs, over various temperature ranges, of SI-specific NQR spectral profile v temperature.

Figure 2:
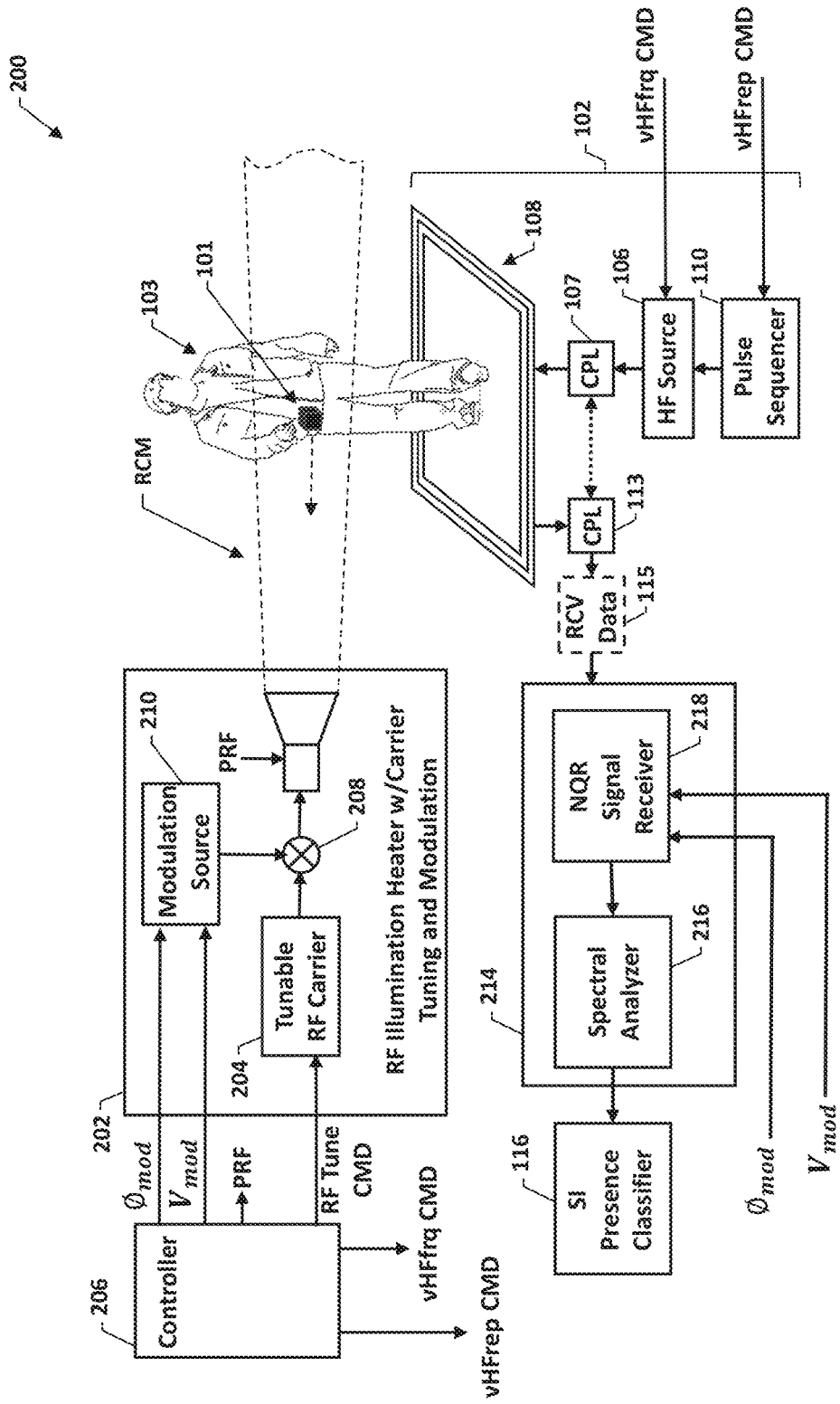
FIG. 2 shows a functional block schematic of another system for TM NQR detection of substances, featuring controlled positioning of NQR sidebands between comb frequencies, in accordance with one or more embodiments.

FIG. 2 shows a functional block schematic of a system 200, which is another example system for TM NQR detection of substances. Features of the system 200 include, without limitation, selective positioning of NQR sidebands via particular, controlled modulation(s) of the RF illumination. Various aspects include, in accordance with one or more embodiments, phase control and frequency control of the modulation of the RF illumination, as described in greater detail in subsequent paragraphs.

Referring to FIG. 2, the system 200 can include an RF illumination heater 202 that, in overview, is configured to transmit a RF illumination RCM, with as a controllably modulated, tunable carrier signal. The tunable carrier provides, among other features, dynamic or event-driven adjustment of the RF illumination beam to match absorption profiles of different TI materials. The controllable aspects of modulation can include controllable modulation frequency Vmod and controllable phase Ø mod. Implementation can include RF mixer 208, and tunable modulation source 210, with the source 210 receiving Vmod and Ø mod from the controller 206.

The modulation frequency and modulation phase can be adjusted, for example, to interact with the HF frequency of the NQR excitation field source in a manner that moves, i.e., selectively positions the NQR spectral lines on the frequency axis to avoid interference, e.g., from spectral lines of the HF excitation field. As illustration, the NQR excitation field source 102 can be configured, as described above, to expose the TI 103 to a field with a comb structure, meaning spectral lines spaced apart on the frequency axis in a comb fashion. The frequency spacing of the comb lines is the HF repetition frequency vHFrep, is shown controlled by the vHFrep CMD signal generated by the controller 206. The HF frequency vHFfrq, is shown controlled by the vHFfrq CMD signal generated by the controller 206.

In an aspect, the modulation frequency Vmod of the RF illumination beam can be set to place the NQR signal spectral lines at positions that lie between the lines of the original HF comb. The modulation frequency Vmod, of the can also place the NQR signal spectral lines at positions that may avoid interference from external sources, such as but not limited to amplitude modulated (AM) commercial radio sites. The system 200 controllable placement of the NQR response spectra, can provide substantial increase in signal-to-noise ratio, which in turn can provide substantial reduction in false alarm rate.

Figure 3A:
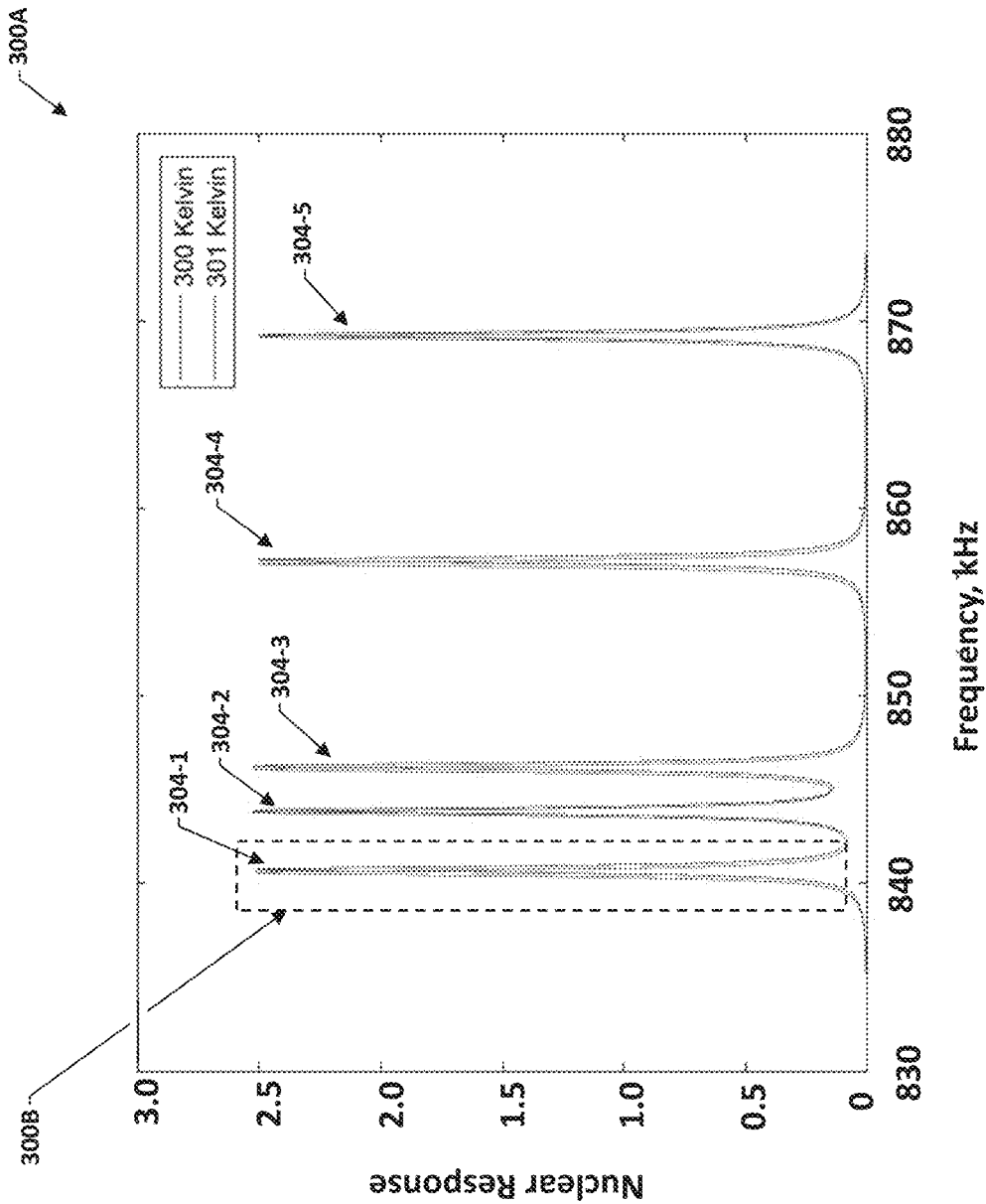
FIG. 3A shows an example spectroscopic signature frequency shift, resulting from an incremental heating of one TI, through a TM NQR excitation in processes for TM-NQR detection of SIs in accordance with one or more embodiments.
Figure 3B:
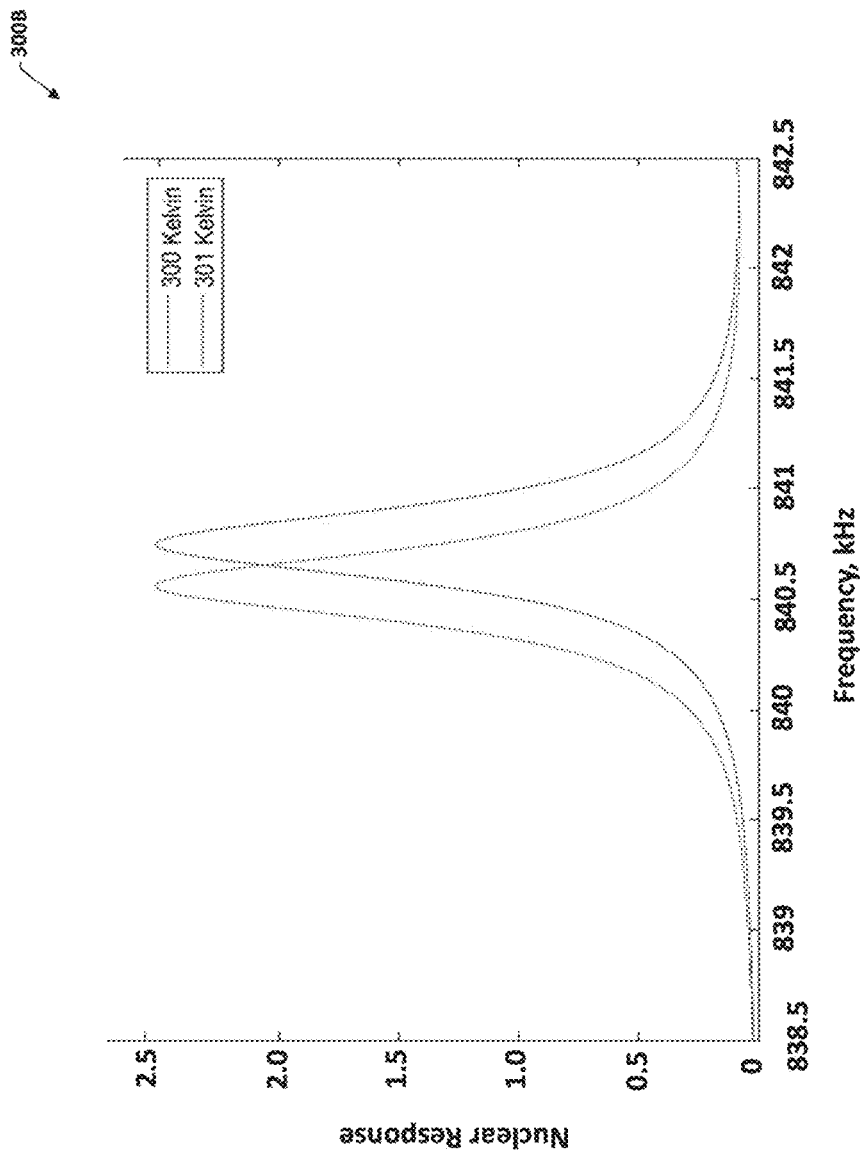
FIG. 3B shows an enlarged view of the temperature-induced frequency shift of one of the FIG. 3A NQR sideband in accordance with one or more embodiments.
Figure 3C:
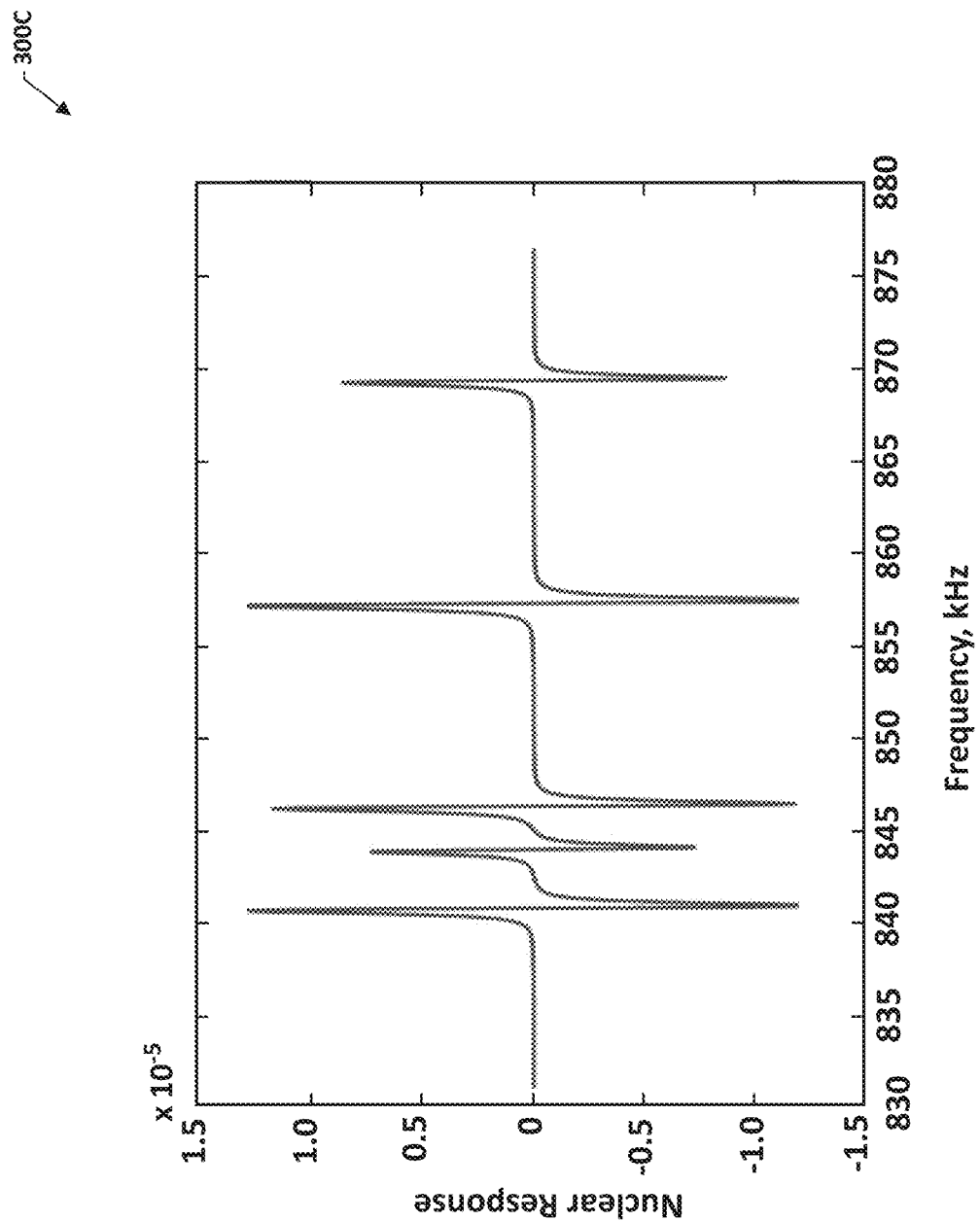
FIG. 3C shows a graph of the derivative of NQR spectrum with respect to temperature, at an example temperature, of the TI subject of FIGS. 3A and 3B in accordance with one or more embodiments.

FIG. 3A shows an example NQR spectroscopic signature 300A obtained from trinitrotoluene (TNT), through a TM NQR excitation in processes for TM-NQR detection of SIs in accordance with one or more embodiments. The blue-line plot shows the NQR side bands at 300 degrees K, and the red-line plot shows the NQR sidebands at 301 degrees K. The first sideband 304-1, third sideband 304-3, and fourth sideband 304-4 show a right-to-left shift, while the second sideband 304-2 and fifth sideband 304-5 show little shift. As can also be seen, the right-to-left shift of the fourth sideband 304-4 that results from temperature increase from 300 degrees K to 301 degrees K is greater than the shift exhibited by the first sideband 304-1 and third sideband 304-3. The respectively different shifts of the NQR sidebands are signatures of TNT, and are obtained through RF illumination in accordance with disclosed embodiments. FIG. 3B shows an enlarged view of the temperature-induced frequency shift of the FIG. 3A first NQR sideband 304-1. FIG. 3C. shows a graph of the derivative with respect to temperature, at 300 degrees K, of the FIG. 3A NQR sidebands 304-1, 304-2, 304-3, 304-4, 304-5 of TNT.

In systems and methods in accordance with disclosed embodiments, such TI NQR spectra can be compared, and classified using the above-described NQR spectrum v, temperature database, e.g., via artificial intelligence techniques.

Figure 4:
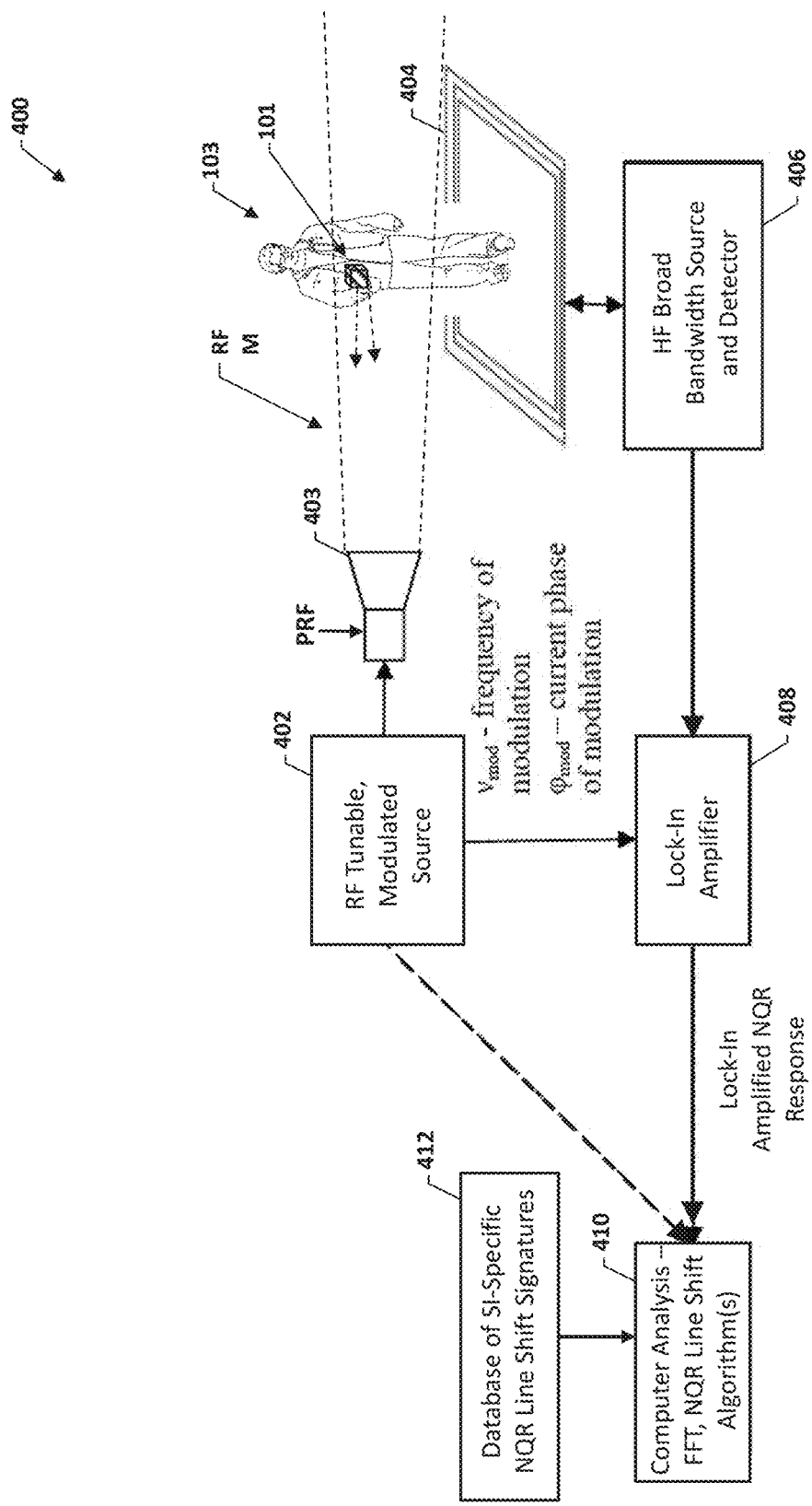
FIG. 4 shows a functional block schematic of another system for TM NQR detection of SIs in accordance with one or more embodiments.

FIG. 4 shows a functional block schematic of an implementation of another system 400 for TM NQR detection of SIs in accordance with one or more embodiments. The system 400 includes a modulated, tunable RF source 402, an HF coil 404, an HF broad bandwidth source and detector 406. The modulated, tunable RF source 402 in operation illuminates the TI and BI with a the collimated beam RFM. The tunable RF source emitted at a frequency v, typically in the GHZ range, is modulated at a frequency v mod, often a few hundred Hz.

The collimated beam RFM illumination of the TI and BI has a dual effect. First, a portion of RFM illumination is reflected and, in an aspect, the reflection can be detected, providing a radar detection modality. The radar detection modality, as described in greater detail in reference to FIG. 8, can enable identification of the position of the TI and better define a detection geometry. The second effect is that RF power energy from the RFM illumination is absorbed by the TI, effecting a safe, but significant for purposes of NQR shift, temperature increase of the whole object, including the hidden TI such as explosives or drugs. The specific temperature change depends on the power PRF and frequency of the RF radiation vRF, the absorptivity coefficient of RF radiation αRF, the heat capacity of target substance. The RF absorption spectra and heat capacity of the substance influence the NQR signature of a particular substance in a unique way, forming additional discriminating signatures, as described in reference to FIGS. 2 and 3.

The HF coil 404, shown separate from the modulated, tunable RF source 402, delivers structured, broad band electromagnetic pulses adapted to target discrimination to excite the NQR effect within the whole volume of the TI and BI. The repetition frequency of the HF pulses is vHFrep. The NQR active nuclei within both the TI and BI emit radiation characteristic of the nuclei and substance that is captured by the same coil.

In operation, the return signal is sent to the lock in amplifier 408, where the TI component (i.e., in a defined phase relationship with the modulated RF signal) is amplified. The HF signal is broad band and periodic; in the frequency domain, its spectrum consists of equally spaced lines, separated by the HF repetition frequency vHFrep. Such a structure is called a radio frequency comb. The interaction with RF illumination can induce new components in the HF spectrum that are shifted by v mod, which lie in between the lines of the original HF comb. This placement of the NQR response enables efficient, low noise detection of the TI and BI response. Moreover, such a detection modality allows for recording the response of the TI and BI without interference from the strong, illuminating HF field.

Other relative spatial arrangements of the RF source 402 and HF sources are possible, allowing for a broad range of detection modalities tailored to the venue.

Figure 5:
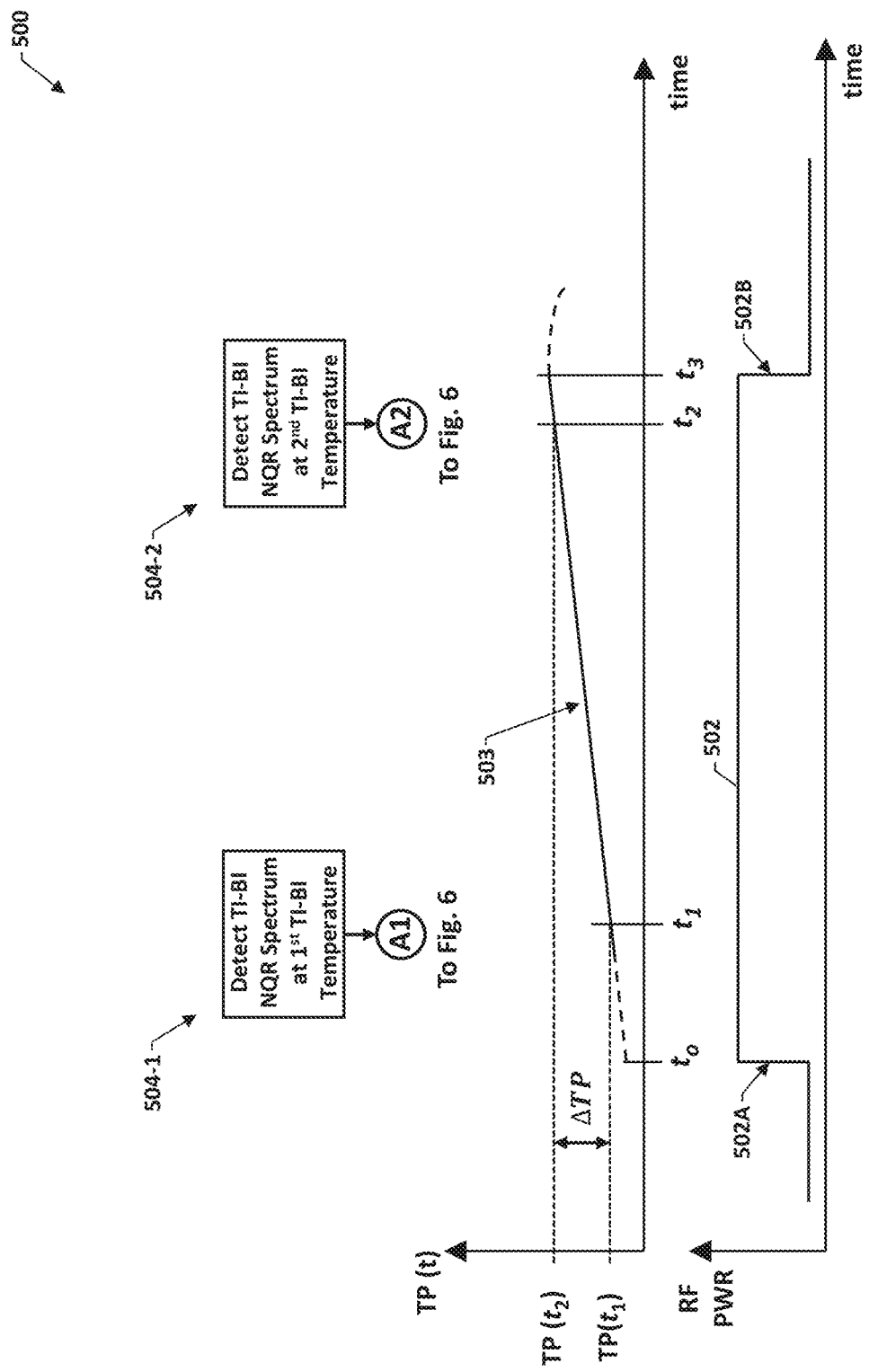
FIG. 5 shows a flow diagram of operations in one example process in a TM NQR detection and classification of SIs in accordance with one or more embodiments.

FIG. 5 is a flow diagram 500 of operations in one implementation of a process in TM-NQR detection of SIs in accordance with one or more embodiments. The phrase "flow 500" will be understood to mean "operations in a flow according to the diagram 500." Description of the flow 500 includes references to specific systems shown in FIGS. 1, 2, and 4. It will be understood that the references are to present examples. They are not intended to limit processes according to the flow 500, or the scope of the appended claims to the specific system implementations of FIGS. 1-2, and 4.

Referring to FIG. 5 and to FIG. 1 system 100, an instance of the flow 500 can begin at time t0 with commencement 502A of RF illumination 502 of a TI with an RF illumination power (labeled "RF PWR") which can be configured to effectuate—via absorption by the TI—an increase in the TI's temperature. Item 503 illustrates the TI's temperature versus time. The RF illumination source can be, for example, the FIG. 1 RF illumination heater 110. The commencements 502A can be in response to an illumination start signal or equivalent from the system 100 controller 104, e.g., in response to detection of a subject person such as 103 entering a detection region. Implementations can also provide for manual commencement 502A, e.g., in response to a security guard activation.

Operations associated with commencement 502A of RF illuminating 502 can include tuning the RF carrier, for example, in response to the RF Tune CMD generated by the controller 206. Operations can also include initiating or otherwise configuring an RF modulation mode, either in association with the commencement 502A, or in association with FIG. 5 spectral measurement operations described in subsequent paragraphs. Also, in one or more embodiments, a radar illumination mode can be provided. For example, in a combination of the RF radar and RF modulation modes described above, RF illumination 502 can be implemented to start in a radar mode and them after a duration, switch to an NQR spectrum shifting modulation mode. Such operations are described in greater detail with reference to FIG. 8.

The RF illumination 502 is configured to maintain the illumination, and the corresponding heating, for a duration that continues from time t0 to time t1, which for purposes of description can be referred to as a first time. The operations 504-1 can perform a first measuring of the NQR spectra of TI 101, and from t1 to t2, where operations 504-2 can perform a second measuring of the NQR spectra of TI 101. Operations at 504-1 can generate first NQR spectra dataset, e.g., a first set of integer M points from an M-point or larger FFT. Operations at 504-2 can generate second NQR spectra dataset, e.g., a second set of integer M points from the M-point or larger FFT.

Referring to 503, the temperate of the TI at t2 is shown as $\Delta TP$. It will be understood, upon reading the present disclosure in its entirety that features of systems and methods in accordance with disclosed embodiments include, but are not limited to the following: the determination of the actual temperature of TI at T1, i.e., TP(t1) is not necessary; and it is not necessary to have in-operation knowledge of, the actual magnitude of $\Delta TP$ in operations. Instead, as will be appreciated upon reading this disclosure in its entirety, embodiments can configure the RF illumination 502 such that, statistically, $\Delta TP$ is sufficient to obtain a second NQR spectral measurement at t2 that is sufficiently different from the first NQR spectral measurement at t1 to reflect the characteristic temperature dependence that is a signature of the SI or SIs.

Figure 6:
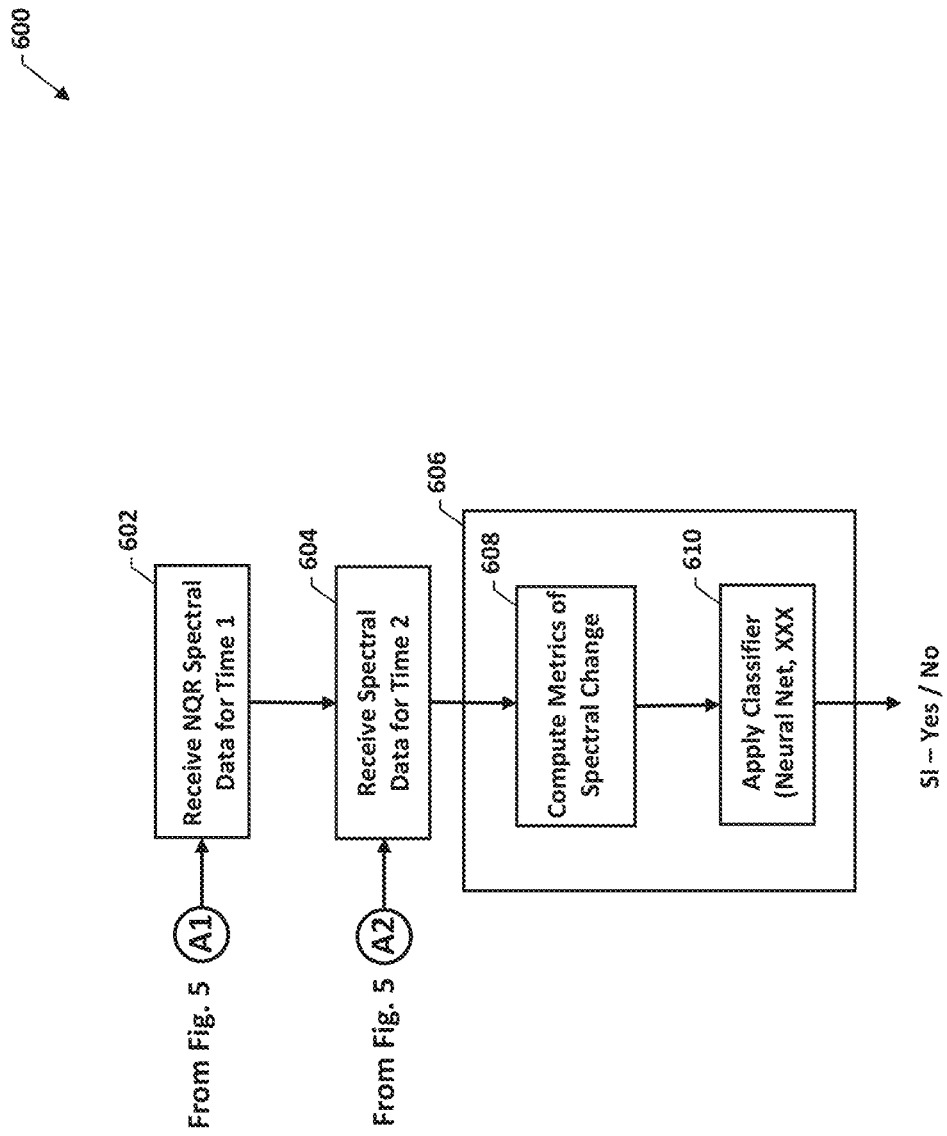
FIG. 6 shows a high level flow diagram of operations in an example SI present/not present classification process, in TM NQR detection of SIs in accordance with one or more embodiments.

Referring to FIG. 5, the first NQR spectra dataset, from operations 504-1, is shown input via jump point A1 to reception block 602 of the FIG. 6 flow 600. Referring to FIG. 6, flow 600 shows a high level flow of operations in an example SI present/not present classification process, in TM NQR detection of SIs in accordance with one or more embodiments. In like manner, the second NQR spectral dataset from operations 504-2 is shown input, via jump point A2, to reception block 604 flow 600. Differences between the first NQR spectral dataset received at 602 and the second NQR spectra dataset received at reception 604 represent a temperature dependence of the NQR spectra of the TI 101, as measured by measurement processes 504-1 and 504-2.

The flow 600 proceeds from 604 to SI—not SI classification 606, where operations can classify the TO as SI present or SI not present, based on the temperature dependence of the NQR spectra of the TI 101, as represented by differences between the first NQR spectra dataset and second NQR spectra dataset. In one example implementation, SI—not SI classification 606 features can include a spectral difference metric(s) determination 608, and a classifier 610.

A consideration in determining the signal power of the RF illumination beam will be described, referring to FIGS. 1 and 5. Assume that subject person 101 has entered the detection area, e.g., above the HF coil 108 briefly before time t0. Assume that the increase of the TI 101, from absorption of the RF illumination from t1 to t2, is labeled $\Delta TP$. Assume a hypothetical of $\Delta TP$ being an acceptable temperature difference in terms of showing a sufficient difference in NQR spectrum to obtain an acceptable accuracy of classifying the TI has SI or not SI. For a given power of the RF illumination beam, the time difference between t1 and t2, i.e., the time required to increase the TI 101 temperature by $\Delta TP$, may be determined in substantial part by the power of the RF illumination beam. The time difference between t1 and t2 can also be determined by the maximum allowable or maximum reasonable time duration the subject person can be expected to remain proximal to the HF excitation coil 108. The RF illumination beam power can therefore be determined, or a first iteration in the determining can be performed, based on a given value for that maximum allowable or reasonable time duration.

Figure 7:
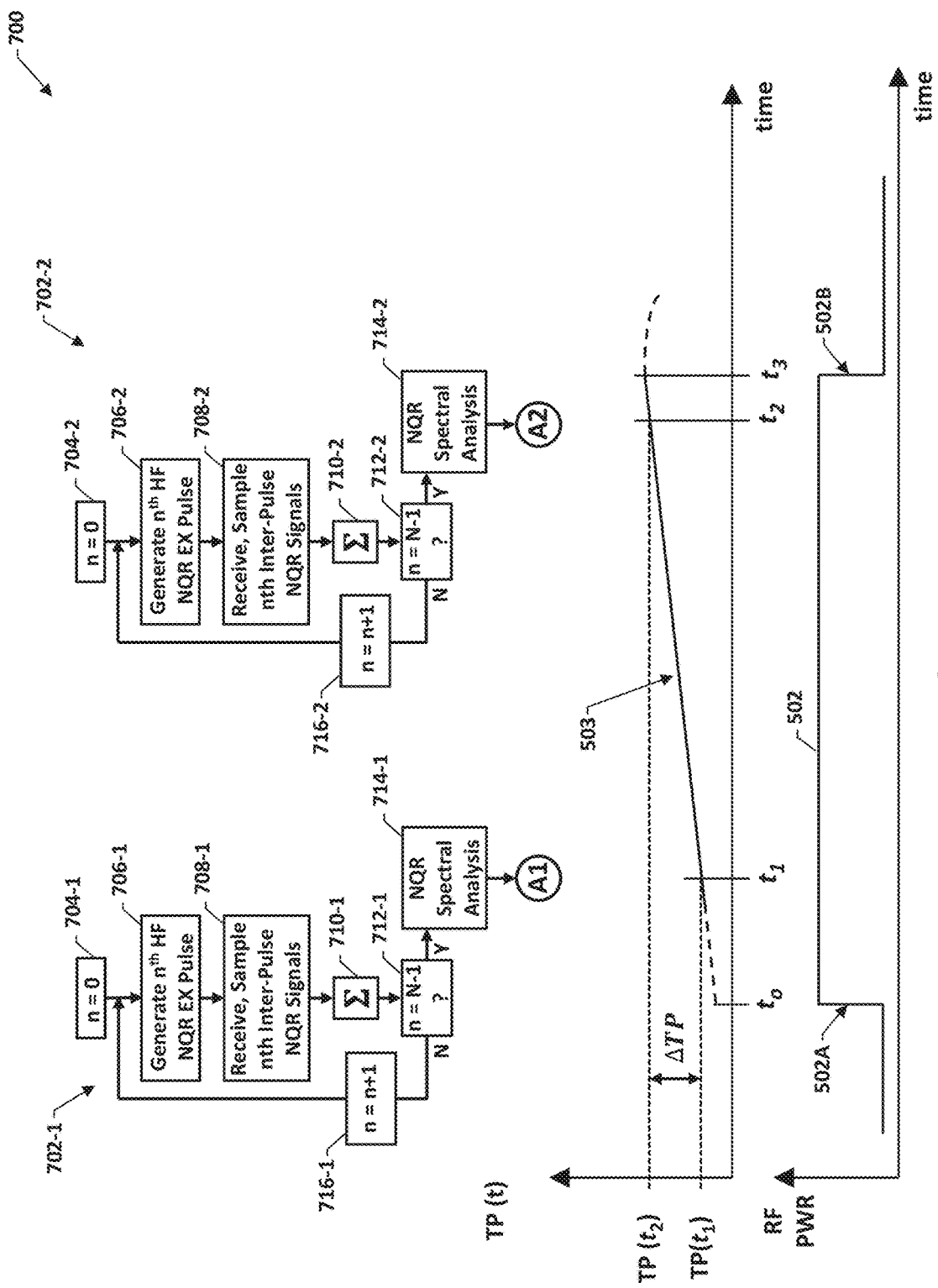
FIG. 7 shows a flow diagram of operations in one process according to the FIG. 5 flow, further showing an example implementation of NQR spectrum determinations.

FIG. 7 shows a flow and timing diagram 700 of various operations in a more specific illustrative implementation of portions of the FIG. 5 flow, in a process for TM NQR detection of SIs in accordance with one or more embodiments. The phrase "flow 700" will be understood to mean "operations in a flow according to the diagram 700." Description of the flow 700 includes references to specific systems shown in FIGS. 1, 2, 4, and to flow 500 and flow 600 shown, respectively, in FIGS. 5 and 6. Also, FIG. 7 carries from FIG. 5 the RF illumination 502, including commencement 502A at t0, first time t1 and second time t2, and the FIG. 5 RF illumination effectuated TI temperature v timeline 503. It will be understood that the references are to present examples. They are not intended to limit processes according to the flow 500, or the scope of the appended claims to the specific system implementations of FIG. 1-2, or 4, or process flows of FIG. 5 or 6.

Referring to FIG. 7, operations 702-1 shows an example implementation of the first measuring 504-1. Operations 702-1 assume an N-pulse SORC or other pulsed, coherent echo NQR excitation sequence. Operations 702-1 can include initializing 704-1 a logic loop counter n to logic 0, and then proceeding to generating 706-1 a first (since n=0) of the N excitation pulses. Operations 702-1 can then proceed to NQR receiving operations 708-1, of receiving and sampling NQR signals, e.g., over a time duration within the inter-pulse interval between the end of the most recent (in this iteration, first (n=0) pulse) and the beginning of the next or n+1 pulse (in this iteration, the second (n=1) pulse) of the NQR excitation field. NQR receiving operations NQR receiving operations sampling the received data. NQR receiving operations 708-1 can be performed, for example, by an NQR receiver functionality of the FIG. 1 NQR receiver—spectrum analyzer 114, or operations of the FIG. 2 NQR receiver 218, or operations of the HF detector functions FIG. 4 HF broad bandwidth source and detector 408.

Operations 702-1 can proceed from NQR receiving operations 708-1 to coherent summing 710-1, and from 710-1 to N-iteration loop termination or escape logic 712-1. The loop termination or escape logic 712-1 notes or detects completion of the N iterations of operations 702-1, i.e., completion of the first NQR spectral measurement, and responds by carrying the operations 702-1 to the NQR spectral analyzing 714-1. Each of the N loops or iterations, as represented by FIG. 7, includes—i) generating 706-1 an excitation pulse; ii) NQR receiving 708-1 of resulting NQR signals; and iii) coherent summing 710-1.

In the presently described instance of operations 702-1 the iteration is the first, so the operations can proceed from the termination or escape logic 712-1 to iteration counter incrementing 716-1, which can increment n to n+1, and then to 706-1 to repeat another cycle. Upon the Nth cycle, operations 702-1 can proceed from 712-1 to NQR spectral analysis 714-1, which generate a first NQR spectral dataset.

The first NQR spectral dataset is effectively a first measurement of the NQR spectra of the TI. The first measurement can be provided, in a logic sense, to the above-described classification process 600 as indicated by the A1 jump point.

It will be understood that the above-described FIG. 7 representation of the first measurement operations 702-1 is a logic representation. The FIG. 7 logic representation uses a block breakdown that aligns with a sequential description of operational features and aspects. the FIG. 7 block breakdown is not necessarily a definition or limitation of operations in an actual fielded implementation. Actual implementations may, for example, and without limitation, omit a discrete "n" counter, or may incorporate the coherent summing 710-1 into the receiving 708-1, or both.

Operations in the flow 700 can include second measurement operations 702-2, at or in an alignment with time t2, of the NQR spectra of the TI. Referring to 503, the temperate of the TI at t2 is shown as ΔTP.

As described in reference to FIG. 5, among features of systems and methods in accordance with disclosed embodiments is that determination of the actual temperature of TI at T1, i.e., TP(t1) is not necessary. It is also not necessary to have knowledge of, i.e., to determine actual magnitude of ΔTP in operations. On the contrary, systems and methods in accordance with various disclosed embodiments can be configured such that statistically, the RF illumination 502 effectuates a temperature increase, between t1 and t2, that is sufficient to obtain a second NQR spectral measurement at t2 that is sufficiently different from the first NQR spectral measurement at t1 to reflect the characteristic temperature dependence that is a signature of the SI or SIs.

Second measurement operations 702-2 can include a loop counter initialization 704-2, followed by N iterations of i) generating 706-2 an excitation pulse; ii) NQR receiving 708-2 of resulting NQR signals; iii) coherent summing 710-2; iv) escape testing 712-2; v) n index incrementing 716-2, before proceeding (upon "Y" exit from 712-2) to NQR spectral analysis 714-2. The NQR spectral analysis 714-2 generates a second NQR spectral dataset that can be provided, in a logic sense, to classification process 600—as indicated by the A2 jump point.

Figure 8:
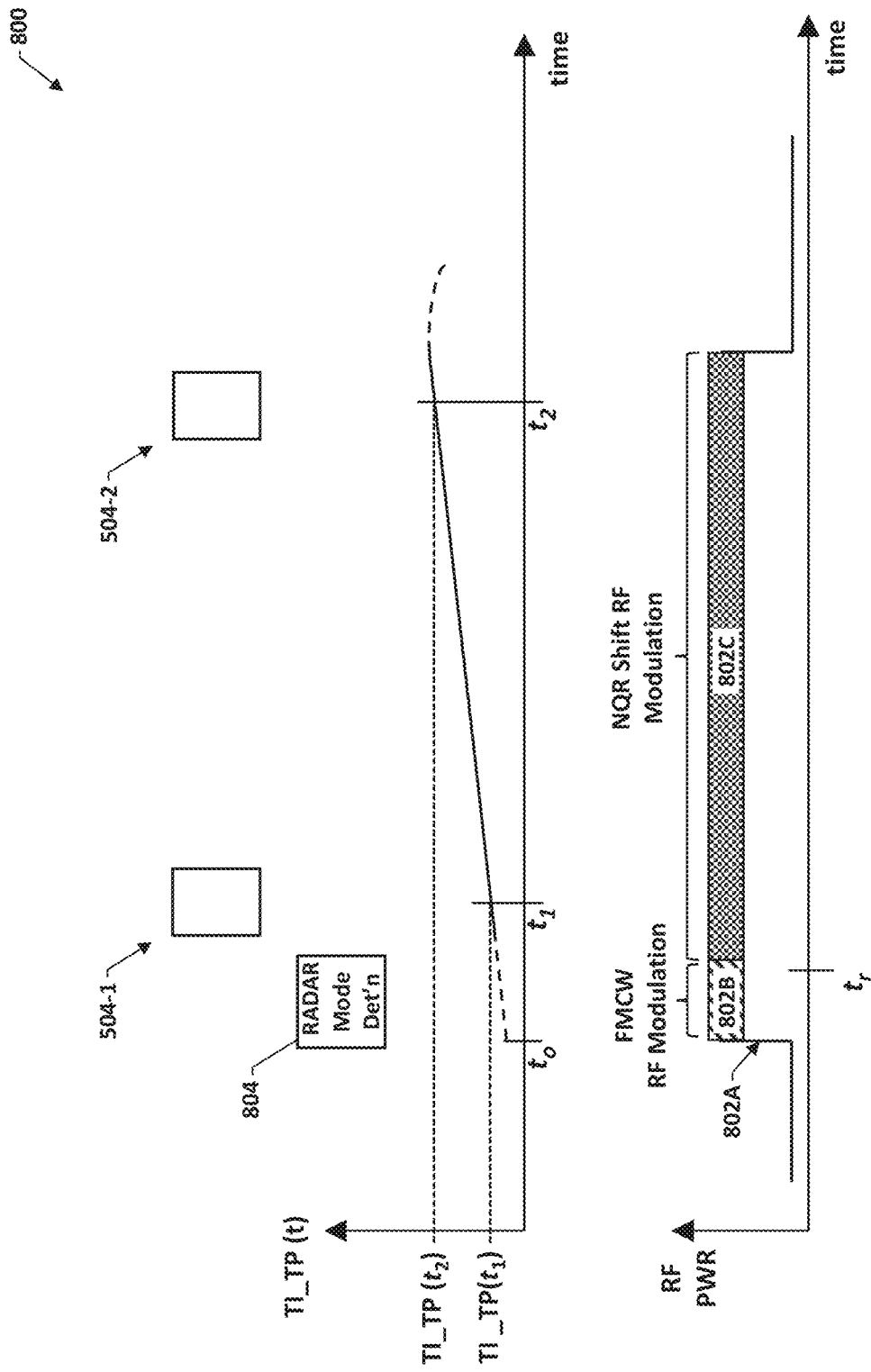
FIG. 8 shows a flow and timing diagram of various operations in an example adaptation of FIG. 7, featuring a switchable radar mode of the RF illuminating, in a process for TM NQR detection of SIs in accordance with one or more embodiments.

FIG. 8 shows a flow and timing diagram of various operations in an example adaptation of FIG. 7, featuring a switchable radar mode of the RF illuminating, in a process for TM NQR detection of SIs in accordance with one or more embodiments.

The phrase "flow 800" will be understood to mean "operations in a flow according to the diagram 800." Description of the flow 800 includes references to specific systems shown in FIGS. 2 and 4, to the flow 500 described in reference to FIG. 5, and to the flow 600 described in reference to FIG. 6. For purposes of description, RF illumination 502, including commencement 502A at t0, first time t1 and second time t2, and RF illumination effectuated TI temperature v timeline 503 are carried from FIG. 5.

In an operation, the modulation source 210 of the FIG. 2 RF illumination heater w/carrier tuning and modulation 202 can be switched, for example, by a modal control from the controller 206, to a frequency modulation continuous wave (FMCW) modulation mode. The RF illumination beam 802 then switches to FMCW mode 802A. Examples of FMCW modulation include, but are not limited to, sawtooth waveforms. The sawtooth configuration, and other FMCW modulation configurations and schemes for 802A can utilize conventional FMCW radar techniques. Such techniques are well-described in widely available radar textbooks. Persons of ordinary skill in the relevant arts, upon reading this this disclosure in its entirety, can readily adapt such FMCW radar techniques to the present disclosure for FMCW radar mode practices in accordance with disclosed embodiments. Accordingly, further detailed description of known techniques for FMCW radar is omitted from this disclosure.

Referring to FIG. 8, at time tr, the FIG. 2 RF illumination heater w/carrier tuning and modulation 202 can be switched, for example, by another modal control from the controller 206, to the TM-NQR mode 802C, as described above in reference to FIG. 5, plot line 502.

Operations in the process 800 can include radar mode detection 804. Operations at 804 can, for example, be implemented by known FMCW techniques.

Figure 9:
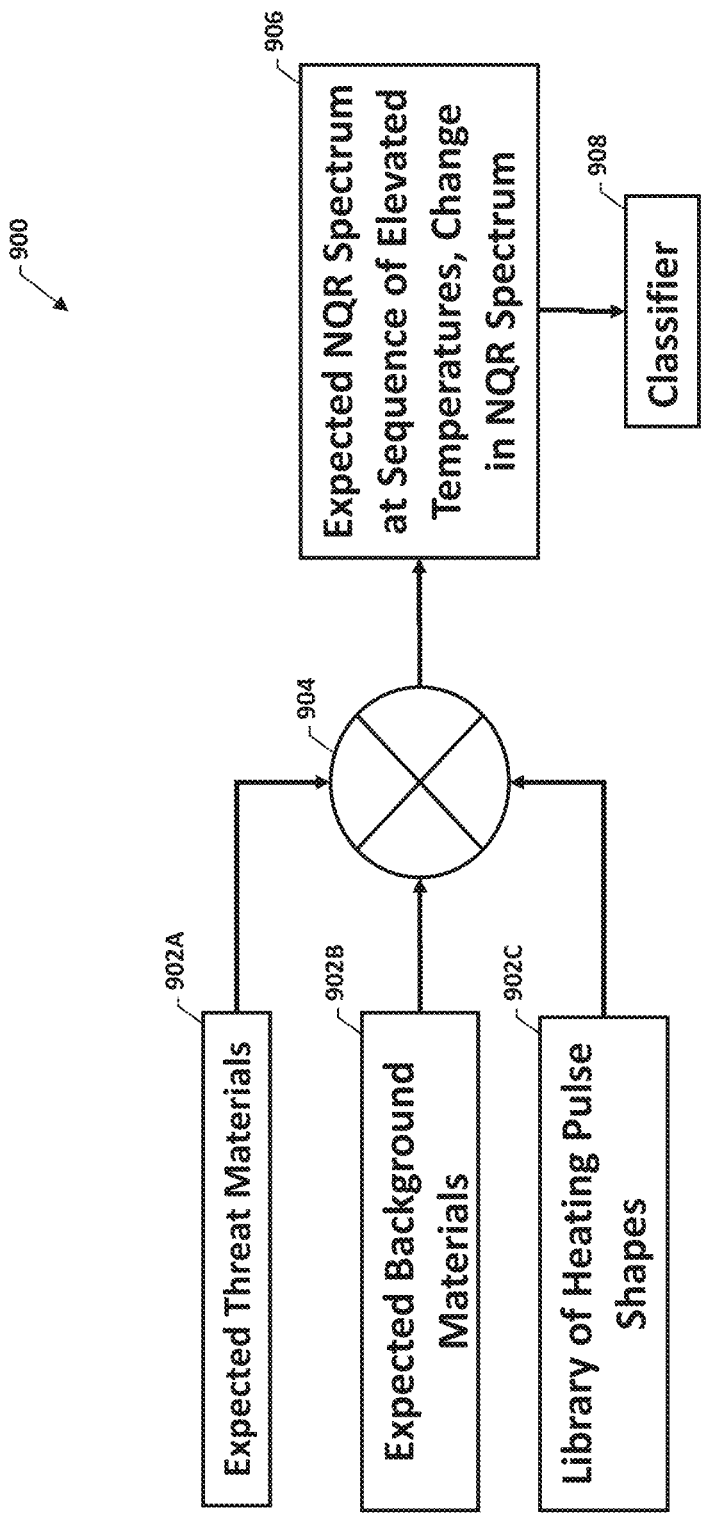
FIG. 9 shows a logic diagram operation in an example process of machine learning by an artificial intelligence (AI) classifier, for various systems and method of TM-NQR detection of SIs in accordance with one or more embodiments.

FIG. 9 shows a logic diagram operation in an example process of machine learning by an artificial intelligence (AI) classifier, for various systems and method of TM-NQR detection of SIs in accordance with one or more embodiments.

The machine learning based classifier that detects the presence of a threat material will be trained utilizing the threat material database (i.e., the dependence of the threat material's NQR on the temperature), the benign background database (the NQR of the background, and human body as a function of the temperature), and the database of possible heating pulse sequences. Each particular combination of the threat material, benign background and the heating pulse sequence will result in the specific variation of the detected NQR signal of the composite system (benign background+ threat material+time dependent heating pulse). This composite dataset will be utilized to create a classifier that can be based on a deep neural network, support vector machine or some other statistical learning approaches.

Figure 10:
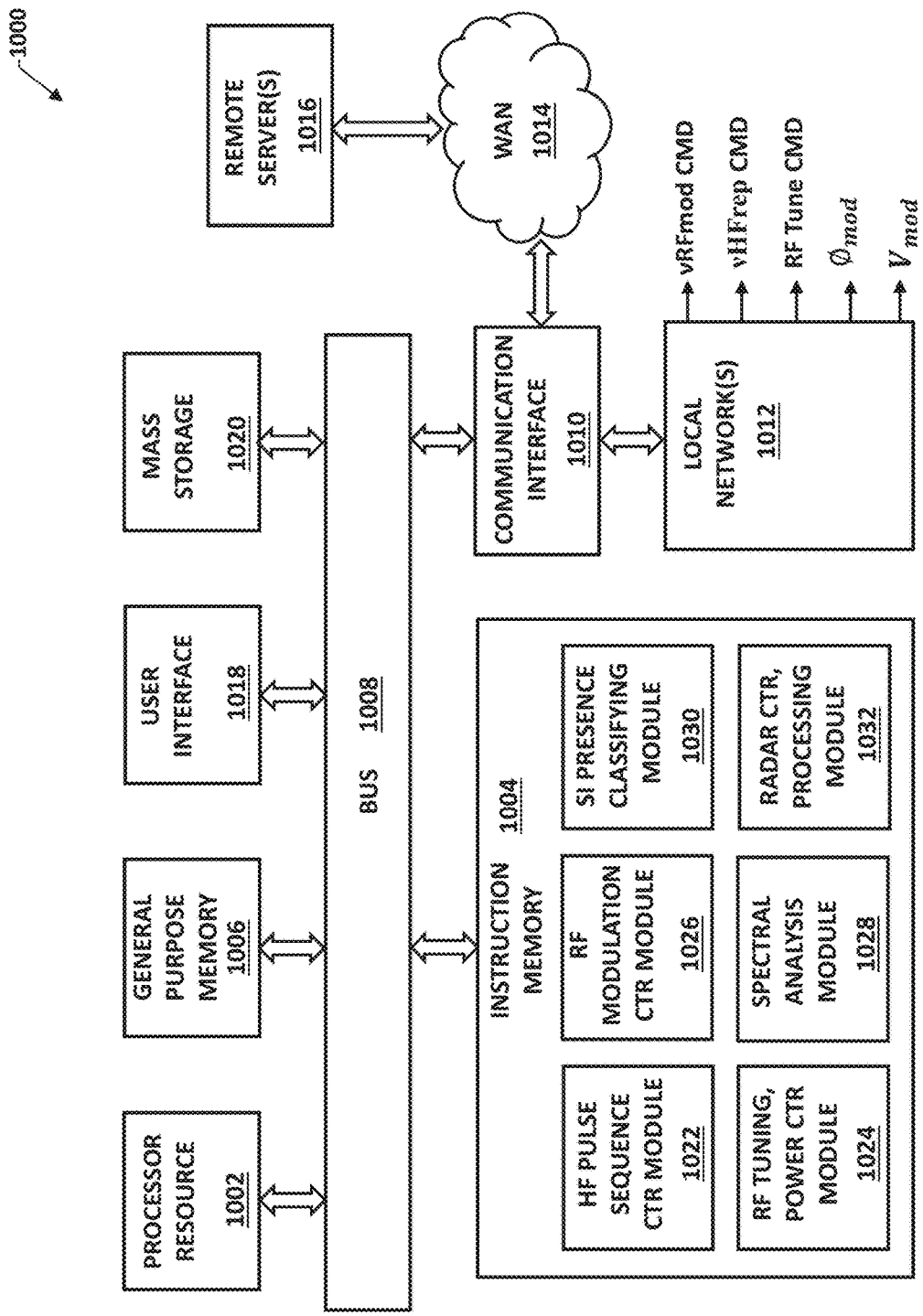
FIG. 10 shows a computer system configured to perform various operations and processes in accordance with disclosed embodiments.

FIG. 10 shows a computer system 1000 upon which aspects of this disclosure may be implemented. It will be understood that functional blocks illustrated in FIG. 10 are logical blocks, and do not necessarily correspond to particular hardware. The computer system 1000 may include a bus a processing resource 1502 communicatively coupled to an instruction memory 1004 and a general purpose memory 1006 by a bus 1008 for processing information. It will be understood that the instruction memory 1004 and the general purpose memory 1006 are not necessarily implemented by physically separate hardware. For example, the instruction memory 1004 and the general purpose memory 1006 can be respective regions, virtual or physical, of a common memory resource.

The computer system 1000 may also include a communication interface 1010 communicatively coupled to the bus 1008, for two-way data communication to local resources, via local network 1012. The communication interface 1010 may provide, for example through an Internet Service Provider (ISP), connection via a wide area network (WAN) 1014, e.g., the Internet, to a remote server 1016.

The instruction memory 1004 and the general purpose memory 1006 can be implemented, for example, by one or more random-access memory devices (RAM)s or other dynamic storage device, coupled to the bus 1008 for storing information and executable instructions to be executed by the processor 1002. The executable instructions can include instruction that, when executed by the processor 1002, cause the processor to perform operations in accordance with the flow diagrams of one or more of FIGS. 5-8. In an implementation, the executable instructions can be configured as modules that, when executed by the processor, cause the processor to implement a particular logic function or combination of logic functions. FIG. 10 shows an example module configuration that includes, but is not limited to, HF pulse sequence module 1022, RF tuning and power control module 1024, RF modulation module 1026, spectral analysis module 1028, SI presence classifying module 1030, and radar control and processing module 1032.

The general purpose memory 1006 may also be used for storing temporary variables or other intermediate information during execution of instructions to be executed by the processor 1002.

The computer system 1000 may be coupled via the bus 1008 to a user interface 1018. The user interface 1018 can include a display and can be configured for receiving various user inputs, such as user command selections and communicating these to the processor 1002, or to the general purpose memory 1006. The user interface 1018 can include physical structure, or virtual implementation, or both, providing user input modes or options, for controlling, for example, a cursor, visible to a user through display or through other techniques, and such modes or operations may include, for example virtual mouse, trackball, or cursor direction keys.

In some examples, hard-wired circuitry may be used in place of or in combination with software instructions. The term "machine-readable medium" as used herein refers to any medium that participates in providing data that causes a machine to operate in a specific fashion. Such a medium may take forms, including but not limited to, non-volatile media, volatile media, and transmission media. Non-volatile media may include, for example, optical or magnetic disks, such as mass storage device 1020. Transmission media may include optical paths, or electrical or acoustic signal propagation paths, and may include acoustic or light waves, such as those generated during radio-wave and infra-red data communications, that are capable of carrying instructions detectable by a physical mechanism for input to a machine.

The instructions also may include program elements, such as an operating system. While execution of sequences of instructions in the program causes the processor 1002 to perform the process steps described herein, hard-wired circuitry may be used in place of, or in combination with, software/firmware instructions for implementation of the processes of the present embodiments. Thus, the present embodiments are not limited to any specific combination of hardware and software.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

As used herein the terms "comprising," "having," "including," and "containing" are to be understood, except where clearly indicated otherwise, as being open-ended terms (e.g., as meaning "including, but not limited to,") except where clearly stated otherwise.

As used herein in the context of a description of a mechanical feature or aspect, the terms "coupled" and "connected" are to be understood to encompass being mechanically coupled or connected, in a permanent, semi-permanent, or removable manner, as well any one among and any combination or sub-combination of: partly or wholly contained, joined together, attached, secured, mounted, and adhered, either directly to one another or through intervening structure(s).

As used herein, the terms "interfacing," "communicatively connected," and "communicatively coupled" and the like, in the context of operative relation, interaction, control, feedback, or other correspondence between or among functions, modules, logic blocks, or other entities are to be understood as encompassing a possessing or being readily switchable to a mode of possessing a functionality, or operability or capability, having operability or capability, of performing, performing operations in, or initiating a communicating of information, directly or indirectly, wirelessly or wired, encrypted or unencrypted, through any means, including but not limited to circuit network, packet-switching network, reconfigurable point-to-point, or fixed point-to-point, and any combination or sub-combination thereof.

It will be understood that the ordering of description herein of operations in methods and processes is not intended as any limitation on the order in which the operations may be performed in practices of disclosed methods and processes. It will be understood that sequential description herein of operations is not intended to limit practices in accordance with this disclosure to performing the described operations in an order, temporal or locational, separate from another, either in terms of time or location.

The use of any and all examples, and use exemplary language (e.g., "such as"), is intended merely to better illuminate examples of the disclosure and does not pose a limitation on the scope of the disclosure unless otherwise claimed.

The Abstract of the Disclosure is provided to allow the reader to quickly identify aspects of the disclosed subject matter. It is not intended as a limitation on the scope or meaning of the claims.

In the Detailed Description, various features are grouped together in various examples for purposes of streamlining the disclosure. The groupings are not to be interpreted as an indication or implication that any claim requires more features than the claim expressly recites. On the contrary, each appended claim stands on its own as a separately claimed subject matter and therefore each of the appended claims is hereby incorporated into the Detailed Description.

What is claimed:

1. A system for detecting presence of substances, comprising:
   a pulsed high frequency (HF) field source, configured to establish in a detection space a pulsed HF excitation field configured to excite NQR resonance of a target of interest (TI);
   a radio frequency (RF) heater, configured to illuminate a target-of-interest (TI) while in the pulsed HF excitation field in the detection space, with an RF energy configured to effect a temperature increase in the TI;
   a spectral receiver, configured to receive signal radiations from a direction of the detection space, over a plurality of time intervals during the RF heater illuminating the TI in the pulsed HF excitation field, and to output a corresponding plurality of NQR spectral datasets; and
   an SI presence classifier, configured to classify, based at least in part on the plurality of NQR spectral datasets, the TI between the SI and excluding the SI.

2. The system according to claim 1, further comprising an RF modulation controller configured to generate an RF modulation frequency control signal and an RF modulation phase control signal:
   the pulsed HF excitation field has a spectral content that, represented in the frequency domain, is an HF comb structure; and
   the RF heater is further configured to generate the RF energy to include a modulated RF energy, and to be coupled to and to receive the RF corresponding to an RF carrier modulated by a modulation signal, wherein:
      the modulation signal is configured to effect an interaction between the modulated RF signal and the pulsed HF excitation field, and
      the interaction is configured to shift, when the TI comprises the SI, NQR spectral lines of the SI to frequency domain positions interspersed between spectral line positions of the HF comb structure.

3. The system according to claim 1, wherein:
   the time intervals during the RF heater illuminating the TI in the pulsed HF excitation field comprise a first measurement time interval and a second measurement time interval, and a start of the second measurement time interval is separated from an end of the first measurement time interval by a time difference, delta T, and
   the RF heater is configured to effect the temperature increase in the TI at a rate, the rate being units of temperature increase with respect to units of time.

4. The system according to claim 3, wherein the RF heater is further configured to illuminate the TI and at least a portion of a background of interest (BI) the BI with the RF energy configured as a collimated RF beam, and wherein the system further comprises:
   an RF receiver, configured to receive an RF return signal from the TI, corresponding to a reflection from the TI of at least a portion of the RF energy, and to output a corresponding RF return signal data; and
   a radar processor, configured to receive the RF return signal data and to generate, based at least in part on the RF return signal data, a radar processing result that indicates at least a likely location of the TI.

5. The system according to claim 1, wherein:
   the RF heater is further configured to illuminate the TI and BI with the RF energy being further configured with a RF spectral content corresponding to an absorption spectra of the TI.

6. The system according to claim 5, wherein:
   the SI presence classifier includes, as a reference signature, an SI-specific signature shift of NQR lines with respect to temperature;
   the RF heater is further configured to illuminate the TI for a duration that extends at least from a first time to a second time, with the RF energy further configured to effect, by the illuminating for the duration, the temperature increase in the TI between the first time and the second time as corresponding statistically to delta T degrees;
   the spectral receiver SI is further configured to:
      compute a first NQR spectral data for the signal radiations at the first time, and
      compute a second NQR spectral data for the second time; and
   the SI presence classifier is further configured to perform the classifying based at least in part on the first NQR spectral dataset and the second NQR spectral dataset.

7. The system according to claim 6, wherein:
   the reference signature is an SI-specific first reference signature, and the SI-specific signature shift of NQR lines with respect to temperature is a first range SI-specific signature shift of NQR lines corresponding to a temperature increase from a first range starting temperature to a first range increased temperature, which is delta T degrees greater than the first range starting temperature;
   the SI presence classifier further comprises a reference database that comprises the SI-specific first reference signature and an SI-specific second reference signature;
   the SI-specific second reference signature corresponds to a signature shift, by the same SI, of NQR lines corresponding to a temperature increase of delta T degrees between a second range starting temperature and a second range increased temperature, the second range increased temperature being delta T degrees greater than the second range starting temperature, the second range starting temperature being different from the first range starting temperature; and
   the SI presence classifier is further configured to perform the classifying based at least in part on the first NQR spectral data, the second NQR spectral data, the SI-specific first reference signature, and the SI-specific second reference signature.

8. The system according to claim 1, wherein:
   the SI is a first SI, the NQR datasets are first NQR datasets, the signal radiations are first signal radiations, and the classifying is a first classifying;

the pulsed HF excitation field is a first pulsed HF excitation field, having characteristics corresponding to an NQR resonance frequency of the first SI;

the NQR excitation field source is further configured to establish in the detection volume a second pulsed HF excitation field, having characteristics corresponding to an NQR resonance frequency of a second SI;

the spectral receiver is further configured to receive second signal radiations from the detection volume, over a plurality of time intervals during the RF heater illuminating the TI in the second pulsed HF excitation field, and output a corresponding plurality of second NQR spectral datasets; and the SI presence classifier is further configured to:
classify, based at least in part on the plurality of second NQR spectral datasets, the second signal radiations from the detection volume between likely including and likely not including a TCC change in NQR spectral content that matches a second SI-specific signature TCC change in NQR spectral content, and output a classification of the TI between the second SI but excluding the second SI.

9. The system according to claim 1, wherein:
the NQR excitation field source comprises a high frequency coil, and
the HF NQR excitation field source is further configured to generate the excitation field with a frequency domain comb structure, which is within a bandwidth of the high-frequency coil.

10. The system according to claim 9, wherein:
the RF heater is further configured to transmit the RF energy as a modulated RF carrier, by a modulation configured to interact with the HF NQR excitation field, to produce additional side bands within the comb structure.

11. The system according to claim 10, wherein the additional side bands are located in between comb lines of the comb structure.

12. A method for detecting presence of substances, comprising:
illuminating a target-of-interest (TI) with an RF energy configured to effect, over a time duration extending from a first time to a second time that is subsequent the first time, an increase in a temperature of the TI;
measuring at a time corresponding to the first time, a first temperature NQR signal spectrum of the TI, and outputting a corresponding first NQR spectrum data set;
measuring at a time corresponding to the second time, a second temperature NQR signal spectrum of the TI, and outputting a corresponding second NQR spectrum data set; and
classifying, based at least in part on the first NQR spectral dataset and the second NQR spectral dataset, the TI between including an SI and not including the SI.

13. The method according to claim 12, wherein:
a pulsed HF excitation field has a spectral content that, represented in the frequency domain, has an HF comb structure; and
the RF energy comprises a modulated RF signal, corresponding to an RF carrier modulated by a modulation signal, wherein:
the modulation signal is configured to effect an interaction between the modulated RF signal and the pulsed HF excitation field, and
the interaction is configured to shift, when the TI includes the SI, NQR spectral lines of the SI to frequency domain positions interspersed between spectral line positions of the HF comb structure.

14. The method according to claim 12, wherein the method further comprises:
receiving an RF return signal from the TI, corresponding to a reflection from the TI of at least a portion of the RF energy, and outputting a corresponding RF return signal data; and
generating, based at least in part on the RF return signal data, a radar result that indicates a likely location of the TI.

15. The method according to claim 12, wherein:
the classifying is further based on a reference signature, the reference signature being an SI-specific signature shift of NQR lines with respect to temperature; and
the classifying is further configured to perform the classifying, based at least in part on the reference signature, the first temperature NQR spectral dataset, and the second temperature NQR spectral dataset.

16. The method according to claim 15, wherein:
the reference signature is an SI-specific first reference signature, and the SI-specific signature shift of NQR lines with respect to temperature is a first range SI-specific signature shift of NQR lines corresponding to a temperature increase from a first range starting temperature to a first range increased temperature, which is delta T degrees greater than the first range starting temperature; and
the SI presence classifier is further configured to perform the classifying, based at least in part on the first NQR spectral dataset, the second NQR spectral dataset, the SI-specific first reference signature, and an SI-specific second reference signature, wherein:
the SI-specific second reference signature corresponds to a signature shift, by the same SI, of NQR lines corresponding to a temperature increase of delta T degrees between a second range starting temperature and a second range increased temperature, the second range increased temperature being delta T degrees greater than the first range starting temperature, and the second range starting temperature being different from the first range starting temperature.

17. The method according to claim 12, wherein:
the pulsed HF NQR excitation field, represented in the frequency domain, is a comb structure,
RF energy is a modulated RF carrier, by a modulation configured to interact with the pulsed HF NQR excitation field to produce additional side bands within the comb structure.

18. A method for detecting presence of substances, comprising:
effecting a temperature increase in a target-of-interest (TI), within a detection space, by operations including illuminating the TI with an RF energy configured for absorption by the TI;
establishing in the detection space, while illuminating the TI with the RF energy configured for absorption by the TI, a pulsed HF excitation field configured to excite NQR resonance of a substance of interest (SI);
receiving signal radiations from a direction of the detection space, over a plurality of time intervals that follow pulses of the pulsed HF excitation field, during the illuminating the TI, and outputting a corresponding plurality of NQR spectral datasets; and:

classifying, based at least in part on the plurality of NQR spectral datasets, the TI between including the SI and not including the SI.

\* \* \* \* \*